United States Patent
Zhang et al.

(10) Patent No.: US 9,905,682 B2
(45) Date of Patent: Feb. 27, 2018

(54) BIDIRECTIONAL MOS DEVICE AND METHOD FOR PREPARING THE SAME

(71) Applicants: UNIVERSITY OF ELECTRONIC SCIENCE AND TECHNOLOGY OF CHINA, Chengdu (CN); INSTITUTE OF ELECTRONIC AND INFORMATION ENGINEERING IN DONGGUAN, UESTC, Dongguan (CN)

(72) Inventors: Jinping Zhang, Chengdu (CN); Zehong Li, Chengdu (CN); Jingxiu Liu, Chengdu (CN); Min Ren, Chengdu (CN); Bo Zhang, Chengdu (CN); Zhaoji Li, Chengdu (CN)

(73) Assignees: UNIVERSITY OF ELECTRONIC SCIENCE AND TECHNOLOGY OF CHINA, Chengdu (CN); INSTITUTE OF ELECTRONIC AND INFORMATION ENGINEERING IN DONGGUAN, UESTC, Dongguan (CN)

( * ) Notice: Subject to any disclaimer, the term of this patent is extended or adjusted under 35 U.S.C. 154(b) by 0 days.

(21) Appl. No.: 15/372,352

(22) Filed: Dec. 7, 2016

(65) Prior Publication Data
US 2017/0084728 A1 Mar. 23, 2017

Related U.S. Application Data

(63) Continuation-in-part of application No. PCT/CN2014/094626, filed on Dec. 23, 2014.

(51) Int. Cl.
*H01L 29/74* (2006.01)
*H01L 29/78* (2006.01)
(Continued)

(52) U.S. Cl.
CPC .... *H01L 29/7424* (2013.01); *H01L 21/02233* (2013.01); *H01L 21/26586* (2013.01);
(Continued)

(58) Field of Classification Search
CPC ............... H01L 29/7424; H01L 29/747; H01L 21/26586; H01L 21/3065; H01L 29/1095;
(Continued)

(56) References Cited

U.S. PATENT DOCUMENTS 5,701,026 A * 12/1997 Fujishima ........... H01L 29/0634
257/335
6,316,807 B1 * 11/2001 Fujishima ........... H01L 29/7809
257/333
(Continued)

*Primary Examiner* — Jarrett Stark
(74) *Attorney, Agent, or Firm* — Matthias Scholl P.C.; Matthias Scholl

(57) ABSTRACT

A bidirectional Metal-Oxide-Semiconductor (MOS) device, including a P-type substrate, and an active region. The active region includes a drift region, a first MOS structure and a second MOS structure; the first MOS structure includes a first P-type body region, a first P+ contact region, a first N+ source region, a first metal electrode, and a first gate structure; the second MOS structure includes a second P-type body region, a second P+ contact region, a second N+ source region, a second metal electrode, and a second gate structure; and the drift region includes a dielectric slot, a first N-type layer, a second N-type layer, and an N-type region. The active region is disposed on the upper surface of the P-type substrate. The first MOS structure and the second MOS structure are symmetrically disposed on two ends of the upper layer of the drift region.

8 Claims, 8 Drawing Sheets

(51) Int. Cl.
  *H01L 21/02*  (2006.01)
  *H01L 21/265*  (2006.01)
  *H01L 21/3065*  (2006.01)
  *H01L 29/10*  (2006.01)
  *H01L 29/40*  (2006.01)
  *H01L 29/66*  (2006.01)
  *H01L 29/747*  (2006.01)

(52) U.S. Cl.
  CPC ...... *H01L 21/3065* (2013.01); *H01L 29/1095* (2013.01); *H01L 29/408* (2013.01); *H01L 29/66386* (2013.01); *H01L 29/747* (2013.01); *H01L 29/78* (2013.01)

(58) Field of Classification Search
  CPC ......... H01L 29/66386; H01L 21/02233; H01L 29/408; H01L 29/78
  See application file for complete search history.

(56) References Cited

U.S. PATENT DOCUMENTS

| | | | | |
|---|---|---|---|---|
| 8,319,314 B2* | 11/2012 | Ogura | ................. | H01L 29/0834 |
| | | | | 257/564 |
| 9,741,837 B2* | 8/2017 | Zhang | ................. | H01L 29/7397 |
| 2005/0179081 A1* | 8/2005 | Kitamura | .......... | H01L 29/66666 |
| | | | | 257/329 |
| 2007/0274110 A1* | 11/2007 | Kitamura | ............ | H01L 27/0629 |
| | | | | 363/62 |
| 2012/0025305 A1* | 2/2012 | Takeda | ................ | H01L 29/7825 |
| | | | | 257/334 |

* cited by examiner

US 9,905,682 B2

BIDIRECTIONAL MOS DEVICE AND METHOD FOR PREPARING THE SAME

CROSS-REFERENCE TO RELATED APPLICATIONS

This application is a continuation-in-part of International Patent Application No. PCT/CN2014/094626 with an international filing date of Dec. 23, 2014, designating the United States, now pending, the contents of which, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, and Cambridge, Mass. 02142.

BACKGROUND OF THE INVENTION

Field of the Invention

The invention relates to a bidirectional Metal-Oxide-Semiconductor (MOS) device and a method for preparing the same.

Description of the Related Art

As shown in FIGS. 1-2, conventional bidirectional MOS devices share one drift region (N-type well) to reduce the length of the drift region. However, the blockage of any one of the devices tends to result in transverse or longitudinal breakdown. In order to solve the breakdown problem, the length of the drift region of the devices must be increased, as a result, the size of the devices, the resistance of the drift region, and the doping dosage in the drift region are increased. Thus, the conventional bidirectional MOS devices have big size and large resistance of the drift region. This reduces the performance of the MOS devices.

SUMMARY OF THE INVENTION

In view of the above-described problems, it is one objective of the invention to provide a bidirectional Metal-Oxide-Semiconductor (MOS) device and a method for preparing the same. In favor of understanding, the present disclosure employs the bidirectional MOS device having N-type channel as example to illustrate, while the MOS device having P-type channel is also practicable.

To achieve the above objective, in accordance with one embodiment of the invention, there is provided a bidirectional Metal-Oxide-Semiconductor (MOS) device, as shown in FIG. 3, comprising a cell structure comprising a P-type substrate and an active region. The active region is disposed on an upper surface of the P-type substrate. The active region comprises a drift region, a first MOS structure and a second MOS structure. The first MOS structure and the second MOS structure are symmetrically disposed on two ends of an upper layer of the drift region.

In a class of this embodiment, the first MOS structure comprises a first P-type body region, a first P+ contact region, a first N+ source region, a first metal electrode, and a first gate structure. The first P+ contact region and the first N+ source region are disposed in the first P-type body region. The first metal electrode and the first gate structure are disposed on an upper surface of the first P-type body region. The first P+ contact region and the first N+ source region are independent, and upper surfaces of the first P+ contact region and the first N+ source region are respectively connected to the first metal electrode. The first gate structure is a planar gate structure, and comprises a first planar gate dielectric and a first gate electrode. The first gate electrode is disposed on an upper surface of the first planar gate dielectric.

In a class of this embodiment, the second MOS structure comprises a second P-type body region, a second P+ contact region, a second N+ source region, a second metal electrode, and a second gate structure. The second P+ contact region and the second N+ source region are disposed in the second P-type body region. The second metal electrode and the second gate structure are disposed on an upper surface of the second P-type body region. The second P+ contact region and the second N+ source region are independent, and upper surfaces of the second P+ contact region and the second N+ source region are respectively connected to the second metal electrode. The second gate structure is the planar gate structure, and comprises a second planar gate dielectric and a second gate electrode. The second gate electrode is disposed on an upper surface of the second planar gate dielectric.

In a class of this embodiment, the drift region comprises a dielectric slot, a first N-type layer having high doping concentration, a second N-type layer having high doping concentration, and an N-type region. The first N-type layer and the second N-type layer are symmetrically disposed on two sides of the dielectric slot. The N-type region is disposed beneath the dielectric slot. A lower surface and a side surface of the first P-type body region are connected to the first N-type layer. A lower surface and a side surface of the second P-type body region are connected to the second N-type layer. The first N-type layer and the second N-type layer each are connected to a side surface on an upper end of the dielectric slot. A lower end of the dielectric slot is embedded in the N-type region. A central line of the dielectric slot is coincident with a central line of the N-type region and a central line of the MOS device. Upper surfaces of the N-type region are respectively connected to the first N-type layer and the second N-type layer, and a lower surface of the N-type region is connected to the P-type substrate. A width and a depth of the dielectric slot are larger than widths and depths of the first N-type layer and the second N-type layer. A depth of an embedded part of the dielectric slot is larger than a width of the dielectric slot, the depths of the first N-type layer and the second N-type layer, and a depth of the N-type region (from a bottom surface of the dielectric slot to an upper surface of the P-type substrate).

In a class of this embodiment, a first P-type region is disposed between the first N-type layer and the P-type substrate. A second P-type region is disposed between the second N-type layer and the P-type substrate. The first P-type region and the second P-type region are symmetrically disposed on two sides of the N-type region, and are connected to side surfaces of the N-type region.

In a class of this embodiment, a first filling slot is disposed on one side of the dielectric slot which is near the first N-type layer. A second filling slot is disposed on another side of the dielectric slot which is near the second N-type layer. The first filling slot and the second filling slot are filled with conductive materials, and are symmetrically disposed. Widths and depths of the first filling slot and the second filling slot are far less than a width and a depth of the dielectric slot. The depths of the first filling slot and the second filling slot are larger than the depths of the first N-type layer and the second N-type layer. An upper part of the first filling slot is connected to a third metal electrode, and an upper part of the second filling slot is connected to a fourth metal electrode. The third metal electrode is in a short connection to the first metal electrode via a first metal wire on a surface of the MOS device. The fourth metal electrode is in a short connection to the second metal electrode via a second metal wire on the surface of the MOS device.

As shown in FIG. 4, an MOS device comprises a cell structure comprising a P-type substrate, a dielectric buried layer, and an active region. The dielectric buried layer is disposed on an upper surface of the P-type substrate. The active region is disposed on an upper surface of the dielectric buried layer. The active region comprises a drift region, a first MOS structure and a second MOS structure. The first MOS structure and the second MOS structure are symmetrically disposed on two ends of an upper layer of the drift region.

In a class of this embodiment, the first MOS structure comprises a first P-type body region, a first P+ contact region, a first N+ source region, a first metal electrode, and a first gate structure. The first P+ contact region and the first N+ source region are disposed in the first P-type body region. The first metal electrode and the first gate structure are disposed on an upper surface of the first P-type body region. The first P+ contact region and the first N+ source region are independent, and upper surfaces of the first P+ contact region and the first N+ source region are respectively connected to the first metal electrode. The first gate structure is a planar gate structure, and comprises a first planar gate dielectric and a first gate electrode. The first gate electrode is disposed on an upper surface of the first planar gate dielectric.

In a class of this embodiment, the second MOS structure comprises a second P-type body region, a second P+ contact region, a second N+ source region, a second metal electrode, and a second gate structure. The second P+ contact region and the second N+ source region are disposed in the second P-type body region. The second metal electrode and the second gate structure are disposed on an upper surface of the second P-type body region. The second P+ contact region and the second N+ source region are independent, and upper surfaces of the second P+ contact region and the second N+ source region are respectively connected to the second metal electrode. The second gate structure is the planar gate structure, and comprises a second planar gate dielectric and a second gate electrode. The second gate electrode is disposed on an upper surface of the second planar gate dielectric.

In a class of this embodiment, the drift region comprises a dielectric slot, a first N-type layer having high doping concentration, a second N-type layer having high doping concentration, and an N-type region. The first N-type layer and the second N-type layer are symmetrically disposed on two sides of the dielectric slot. The N-type region is disposed beneath the dielectric slot. A lower surface and a side surface of the first P-type body region are connected to the first N-type layer. A lower surface and a side surface of the second P-type body region are connected to the second N-type layer. The first N-type layer and the second N-type layer each are connected to a side surface on an upper end of the dielectric slot. A lower end of the dielectric slot is embedded in the N-type region. A central line of the dielectric slot is coincident with a central line of the N-type region and a central line of the MOS device. Upper surfaces of the N-type region are respectively connected to the first N-type layer and the second N-type layer, and a lower surface of the N-type region is connected to the P-type substrate. A width and a depth of the dielectric slot are larger than widths and depths of the first N-type layer and the second N-type layer. A depth of an embedded part of the dielectric slot is larger than a width of the dielectric slot, the depths of the first N-type layer and the second N-type layer, and a depth of the N-type region (from a bottom surface of the dielectric slot to an upper surface of the dielectric buried layer).

In a class of this embodiment, a first P-type region is disposed between the first N-type layer and the dielectric buried layer. A second P-type region is disposed between the second N-type layer and the dielectric buried layer. The first P-type region and the second P-type region are symmetrically disposed on two sides of the N-type region, and are connected to side surfaces of the N-type region.

In a class of this embodiment, a first filling slot is disposed on one side of the dielectric slot which is near the first N-type layer. A second filling slot is disposed on another side of the dielectric slot which is near the second N-type layer. The first filling slot and the second filling slot are filled with conductive materials, and are symmetrically disposed. Widths and depths of the first filling slot and the second filling slot are far less than a width and a depth of the dielectric slot. The depths of the first filling slot and the second filling slot are larger than the depths of the first N-type layer and the second N-type layer. An upper part of the first filling slot is connected to a third metal electrode, and an upper part of the second filling slot is connected to a fourth metal electrode. The third metal electrode is in a short connection to the first metal electrode via a first metal wire on a surface of the MOS device. The fourth metal electrode is in a short connection to the second metal electrode via a second metal wire on the surface of the MOS device In a class of this embodiment, the dielectric buried layer is disposed between the P-type substrate and the N-type region, the first P-type region, and the second P-type region.

In a class of this embodiment, a third P-type region is disposed between a lower part of the dielectric slot and the N-type region; or, the third P-type region is disposed between the dielectric slot and the N-type region; upper parts of the third P-type region are respectively connected to a lower part of the first N-type region and a lower part of the second N-type region.

In a class of this embodiment, a third N-type layer is disposed between the P-type substrate and the N-type region, the first P-type region, and the second P-type region.

In a class of this embodiment, the third N-type layer is disposed between the dielectric buried layer and the N-type region, the first P-type region, and the second P-type region.

A method for preparing the bidirectional MOS device, comprising:

1) allowing a P-type epitaxial layer to epitaxially grow on an upper surface of a P-type substrate;

2) etching a slot on a central part of the P-type epitaxial layer using a photolithography process and an etching process; rotationally injecting N-type impurity from different angles in the slot using an ion implantation process, and forming an N-type region on a side surface and a lower part of the slot; where a lower part of the N-type region is connected to the upper surface of the P-type substrate; two sides of the P-type epitaxial layer containing no N-type impurity are a first P-type region and a second P-type region; the first P-type region and the second P-type region are symmetrically disposed on two sides of the N-type region;

3) filling the slot in 2) with dielectric by oxidation or deposition to form a dielectric slot;

4) using the photolithography process and the ion implantation process to form a first N-type layer having high doping concentration on a first upper part of the N-type region and an upper part of the first P-type region, and to form a second N-type layer having high doping concentration on a second upper part of the N-type region and an upper part of the second P-type region; where the first N-type layer and the second N-type layer each are connected to the side surfaces of the dielectric slot.

5) etching a first filling slot on one side of the dielectric slot which is near the first N-type layer and etching a second filling slot on another side of the dielectric slot which is near the second N-type layer using the photolithography process and the etching process; where the first filling slot and the second filling slot are symmetrically disposed; widths and depths of the first filling slot and the second filling slot are far less than a width and a depth of the dielectric slot; the depths of the first filling slot and the second filling slot are larger than depths of the first N-type layer and the second N-type layer;

6) processing the MOS device by thermo-oxidative treatment and depositing conductive materials; etching away needless conductive materials and oxide layers using a photolithography process to form a first planar gate structure on an upper surface of the first N-type layer, and to form a second planar gate structure on an upper surface of the second N-type layer; filling the first filling slot and the second filling slot with the conductive materials; where the first gate structure comprises a first planar gate dielectric and a first gate electrode; the first planar gate dielectric is disposed on an upper surface of the first N-type layer, and the first gate electrode is disposed on an upper layer of the first planar gate dielectric; the second gate structure comprises a second planar gate dielectric and a second gate electrode; the second planar gate dielectric is disposed on an upper surface of the second N-type layer, and the second gate electrode is disposed on an upper layer of the second planar gate dielectric;

7) injecting P-type impurity to one side of an upper end of the first N-type layer to form a first P-type body region using the photolithography process and the ion implantation process; injecting P-type impurity to one side of an upper end of the second N-type layer to form a second P-type body region using the photolithography process and the ion implantation process; the first P-type body region and the second P-type body region are symmetrical.

8) injecting N-type impurity and P-type impurity respectively to the first P-type body region to form a first N+ source region and a first P+ contact region using the photolithography process and the ion implantation process; where the first N+ source region and the first P+ contact region are independent; injecting N-type impurity and P-type impurity respectively to the second P-type body region to form a second N+ source region and a second P+ contact region using the photolithography process and the ion implantation process; where the second N+ source region and the second P+ contact region are independent;

9) depositing and photoetching metal so as to form a first metal electrode on upper surfaces of the first N+ source region and the first P+ contact region, to form a second metal electrode on upper surfaces of the second N+ source region and the second P+ contact region, to form a third metal electrode on an upper surface of the first filling slot, and to form a fourth metal electrode on an upper surface of the second filling slot; where the third metal electrode is in a short connection to the first metal electrode via a first metal wire on a surface of the MOS device; the fourth metal electrode is in a short connection to the second metal electrode via a second metal wire on the surface of the MOS device.

Specifically, 1) comprises allowing an N-type epitaxial layer to epitaxially grow on an upper surface of the P-type substrate; then allowing the P-type epitaxial layer to epitaxially grow on an upper surface of the N-type epitaxial layer.

Specifically, 1) comprises using silicon-on-insulator to form a dielectric buried layer between the P-type substrate and the P-type epitaxial layer.

Specifically, 1) comprises allowing an N-type epitaxial layer to epitaxially grow between the dielectric buried layer and the P-type epitaxial layer.

Specifically, 2) comprises injecting the P-type impurity to the N-type region following a formation of the N-type region to form a third P-type region; where the third P-type region is disposed beneath the dielectric slot, or the third P-type region is disposed beneath and on side surfaces of the dielectric slot.

Advantages of the bidirectional MOS device and the method for preparing the same according to embodiments of the invention are summarized as follows:

A U-shaped symmetrical drift region, comprising the dielectric slot, the N-type region, the first filling slot, the second filling slot, (the first filling slot and the second filling slot are symmetrically arranged), the first N-type layer, the second N-type layer, (the first N-type layer and the second N-type layer are symmetrically arranged), the first P-type region, and the second P-type region (the first P-type region and the second P-type region are symmetrically arranged) is able to achieve a high breakdown voltage and a low voltage drop or on-resistance at a certain width of the device. Thus the bidirectional MOS device is a symmetrical field stop device. At the IGBT work mode, the MOS device is an IGBT device featuring carrier storage layer and field stop layer; at the MOS work mode, the bidirectional MOS device is an MOS device featuring highly doped layer operating to decrease the resistance of the drift region and field stop layer. The compound effect of the U-shaped drift region prevents the transverse and longitudinal breakdown of the device, and endows the device with favorable voltage endurance per unit drift region length and low voltage drop and on-resistance, thereby obviously improving the performance of the device.

BRIEF DESCRIPTION OF THE DRAWINGS

The invention is described hereinbelow with reference to the accompanying drawings, in which.

DETAILED DESCRIPTION OF THE EMBODIMENTS

For further illustrating the invention, experiments detailing a bidirectional MOS device and a method for preparing the same are described below. It should be noted that the following examples are intended to describe and not to limit the invention.

Example 1

Figure 1:
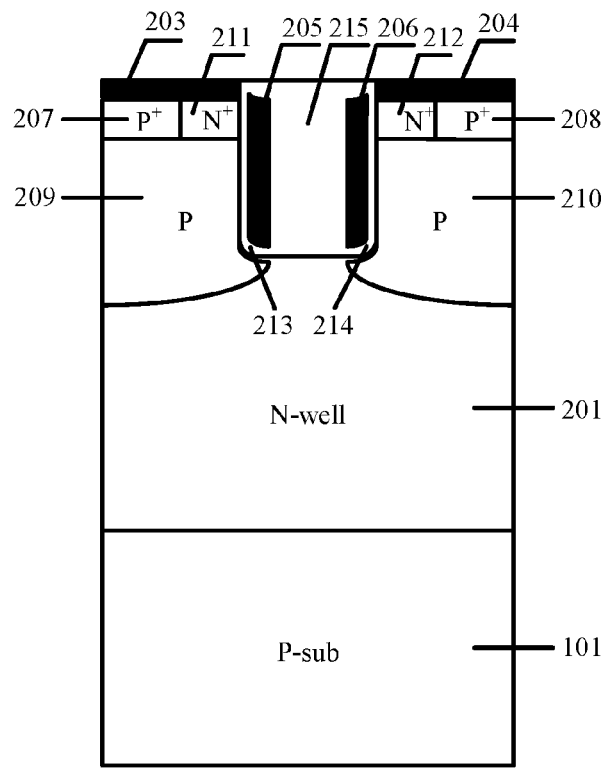
FIG. 1 is a schematic diagram of a trench structure of a conventional bidirectional MOS device.
Figure 2:
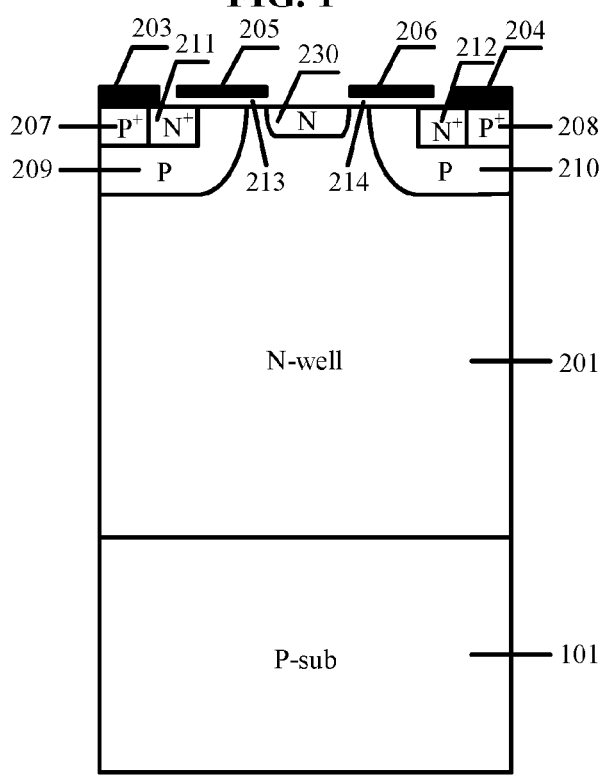
FIG. 2 is a schematic diagram of a planar structure of a conventional bidirectional MOS device.
Figure 3:
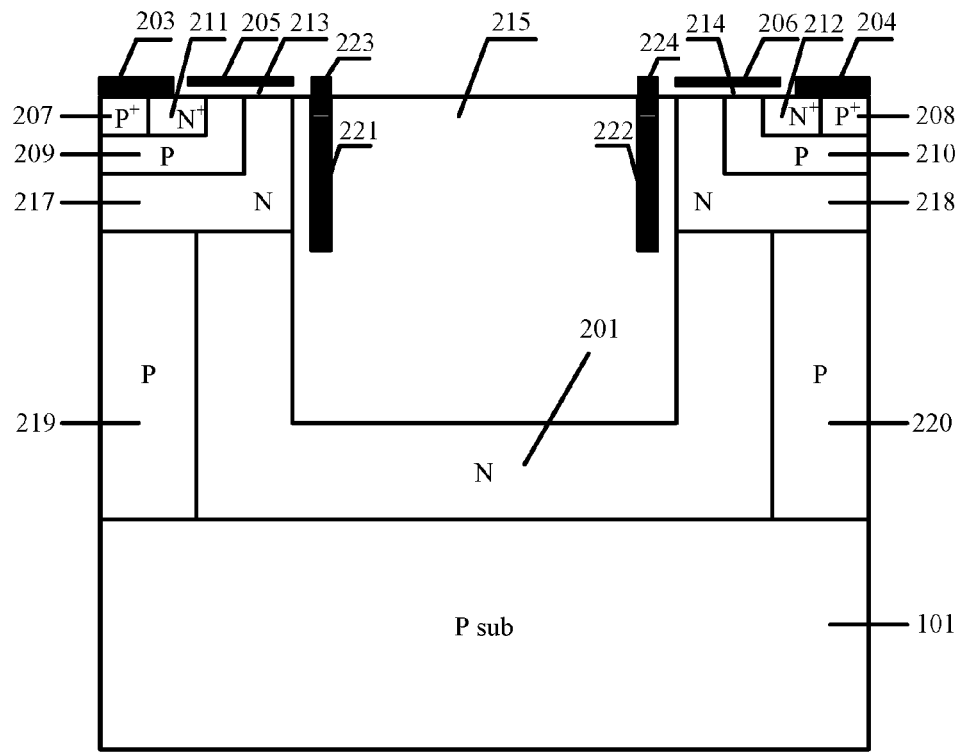
FIG. 3 is schematic diagram of a cell structure of a bidirectional MOS device in Example 1.

FIG. 3 is schematic diagram of a cell structure of a bidirectional MOS device. As shown in FIG. 3, the bidirectional MOS device comprises a P-type substrate 101 and an active region. The active region is disposed on an upper surface of the P-type substrate 101. The active region comprises a drift region, a first MOS structure and a second MOS structure. The first MOS structure and the second MOS structure are symmetrically disposed on two ends of an upper layer of the drift region.

The first MOS structure comprises a first P-type body region 209, a first P+ contact region 207, a first N+ source region 211, a first metal electrode 203, and a first gate structure. The first P+ contact region 207 and the first N+ source region 211 are disposed in the first P-type body region 209. The first metal electrode 203 and the first gate structure are disposed on an upper surface of the first P-type body region 209. The first P+ contact region 207 and the first N+ source region 211 are independent, and upper surfaces of the first P+ contact region and the first N+ source region are respectively connected to the first metal electrode 203. The first gate structure is a planar gate structure, and comprises a first planar gate dielectric 213 and a first gate electrode 205. The first gate electrode is disposed on an upper surface of the first planar gate dielectric 213.

The second MOS structure comprises a second P-type body region 210, a second P+ contact region 208, a second N+ source region 212, a second metal electrode 204, and a second gate structure. The second P+ contact region and the second N+ source region are disposed in the second P-type body region. The second metal electrode and the second gate structure are disposed on an upper surface of the second P-type body region. The second P+ contact region 208 and the second N+ source region 212 are independent, and upper surfaces of the second P+ contact region and the second N+ source region are respectively connected to the second metal electrode 204. The second gate structure is the planar gate structure, and comprises a second planar gate dielectric 214 and a second gate electrode 206. The second gate electrode is disposed on an upper surface of the second planar gate dielectric 214.

The drift region comprises a dielectric slot 215, a first N-type layer 217 having high doping concentration, a second N-type layer 218 having high doping concentration, and an N-type region 201. The first N-type layer and the second N-type layer are symmetrically disposed on two sides of the dielectric slot 215. The N-type region is disposed beneath the dielectric slot 215. A lower surface and a side surface of the first P-type body region 209 are connected to the first N-type layer 217. A lower surface and a side surface of the second P-type body region 210 are connected to the second N-type layer 218. The first N-type layer 217 and the second N-type layer 218 each are connected to a side surface on an upper end of the dielectric slot 215. A lower end of the dielectric slot 215 is embedded in the N-type region 201. A central line of the dielectric slot 215 is coincident with a central line of the N-type region 201 and a central line of the MOS device. Upper surfaces of the N-type region 201 are respectively connected to the first N-type layer 217 and the second N-type layer 218, and a lower surface of the N-type region is connected to the P-type substrate 101. A width and a depth of the dielectric slot 215 are larger than widths and depths of the first N-type layer 217 and the second N-type layer 218. A depth of an embedded part of the dielectric slot 215 is larger than a width of the dielectric slot 215, the depths of the first N-type layer 217 and the second N-type layer 218, and a depth of the N-type region 201 (from a bottom surface of the dielectric slot 215 to an upper surface of the P-type substrate 101).

A first P-type region 219 is disposed between the first N-type layer 217 and the P-type substrate 101. A second P-type region 220 is disposed between the second N-type layer 218 and the P-type substrate 101. The first P-type region 219 and the second P-type region 220 are symmetrically disposed on two sides of the N-type region 201, and are connected to side surfaces of the N-type region 201.

A first filling slot 221 is disposed on one side of the dielectric slot 215 which is near the first N-type layer 217. A second filling slot 222 is disposed on another side of the dielectric slot which is near the second N-type layer 218. The first filling slot 221 and the second filling slot 222 are filled with conductive materials, and are symmetrically disposed. Widths and depths of the first filling slot and the second filling slot are far less than a width and a depth of the dielectric slot 215. The depths of the first filling slot 221 and the second filling slot 222 are larger than the depths of the first N-type layer 217 and the second N-type layer 218. An upper part of the first filling slot 221 is connected to a third metal electrode 223, and an upper part of the second filling slot 222 is connected to a fourth metal electrode 224. The third metal electrode 223 is in a short connection to the first metal electrode 203 via a first metal wire on a surface of the MOS device. The fourth metal electrode 224 is in a short connection to the second metal electrode 204 via a second metal wire on the surface of the MOS device.

A symmetrical drift region comprises the dielectric slot 215, the N-type region 201, the first filling slot 221, second filling slot 222, (the first filling slot and the second filling slot are symmetrically arranged), the first N-type layer 217, the second N-type layer 218, (the first N-type layer and the second N-type layer are symmetrically arranged), the first P-type region 219, and the second P-type region 220 (the first P-type region and the second P-type region are symmetrically arranged).

The bidirectional MOS device controls the first gate electrode 205 and the second gate electrode 206 of the MOS having two symmetrical N-channels so that the MOS device can be applied to the bidirectional IGBT mode or the bidirectional MOS mode. To keep it simple, the current flow direction from the second metal electrode 204 to the first metal electrode 203 in FIG. 3 is used as an example to illustrate the invention, and the other flow direction shares the same working principle. 1) IGBT work mode: the second gate electrode 206 is controlled so as to cutoff the channel of the second MOS structure, thus the second MOS structure is similar to the collector of the conventional unidirectional IGBT device, and the first MOS structure is similar to the emitter of the conventional unidirectional IGBT device. The IGBT is turned on or off by controlling the first gate electrode 205. 2) MOS work mode: the second gate electrode 206 is controlled to turn on the channel of the second MOS structure, thus the second MOS structure is similar to the drain of the conventional unidirectional MOS device, and the first MOS structure is similar to the source of the conventional unidirectional MOS device. The MOS is turned on and off by controlling the first gate electrode 205.

At the IGBT work mode, the first N-type layer 217 is used as the carrier storage layer operating to improve the carrier concentration in the drift region, and the second N-type layer 218 is used as the field stop layer operating to prevent the electric field penetration in the drift region, improve the breakdown voltage, and decrease the voltage drop; at the MOS work mode, the first N-type layer 217 is used as the highly doped layer operating to decrease the resistance of the drift region, and the second N-type layer 218 is used as the field stop layer operating to prevent the electric field penetration in the drift region, improve the breakdown voltage, and decrease the voltage drop.

The formation of the dielectric slot 215 enables the drift region to be U-shaped, and at a certain width of the device, increases the equivalent length of the drift region. Compared with other semiconductor materials, the dielectric in the dielectric slot feature high critical breakdown electric field, thus the blocking voltage of the device is improved, and the voltage drop/on-resistance and the size of the device are decreased. At a certain width of the device, a wide and deep dielectric slot 215 (and the width is larger than the depth) enables the device to have a long equivalent length of the drift region, improves the transverse voltage blocking ability of the dielectric slot 215, further increases the blocking voltage per unit width of the device, and reduces the voltage drop/on-resistance.

To avoid the longitudinal partial depletion of the part of the second N-type layer 218 which is near the dielectric slot 215 because of the potential difference on two sides of the dielectric slot 215 when the device is blocked (the depletion tends to result in penetration of part of the longitudinal depletion layer in the second N-type layer 218 which is near the dielectric slot 215, on a relatively low voltage, penetration and breakdown of the depletion layer of the device tend to occur), the second filling slot 222 filled with conductive materials which is connected to the fourth metal electrode 224 (the fourth metal electrode 224 is in a short connection to the second metal electrode 204 via a metal wire) and is disposed deeper than the second N-type layer 218 is provided in the invention to shield against the influence of the first metal electrode 203 having the lower potential, avoiding the penetration and breakdown of the second N-type layer. In addition, the first filling slot 221 filled with conductive materials which is connected to the third metal electrode 223 (the third metal electrode 223 is in a short connection to the first metal electrode 203 via a metal wire) and is disposed on the side having the low potential is used as the field plate when the device is blocked and is adapted to introduce a new electrical field peak, reduce the adverse effect of the first N-type layer 217 on the breakdown characteristics of the device, improve the electrical field of the longitudinal drift region on the side having the low potential, and further improve the breakdown voltage.

When the device is blocked, the substrate assisted depletion effect provided by the P-type substrate 101, the dielectric assisted depletion effect provided by the dielectric slot 215, and the transverse charge compensation effect provided by the first P-type region 219 and the second P-type region is combined to increase the concentration of the N-type region 201 and the breakdown voltage per unit length of the drift region on two sides and bottom part of the dielectric slot 215, thus the breakdown voltage of the device per unit width of the device is increased, and the voltage drop/on-resistance of the device is decreased. Meanwhile, the electrical field shielding of the negative charges introduced by the first P-type region 219 can work to further reduce the adverse effect of the first N-type layer 217 having a high concentration on the voltage endurance of the device, improve the concentration of the first N-type layer 217, further increase the breakdown voltage of the device per unit width of the device, and decrease the voltage drop/on-resistance of the device; when the breakdown of the device happens, the N-type region 201, the first N-type layer 217, the first P-type region 219, and the second P-type region 220 have all depleted, while the second N-type layer 218 has only partially depleted. The second N-type layer 218 which has partially depleted is used as the field stop layer operating to effectively prevent the transverse and longitudinal field breakdown or penetration of the drift region of the device.

In conclusion, at a certain width of the device, the device in the invention features high breakdown voltage and low forward voltage drop/on-resistance. Because the structure and the working characteristics of the device are completely symmetrical, at a certain width of the device, the device in the invention features high breakdown voltage and low forward voltage drop/on-resistance either with a forward voltage, or with a reverse voltage. The bidirectional MOS device featuring symmetrical forward and reverse characteristics is a field stop device having a U-shaped drift zone. At the certain width of the device, the bidirectional MOS device has better performance.

Example 2

Figure 4:
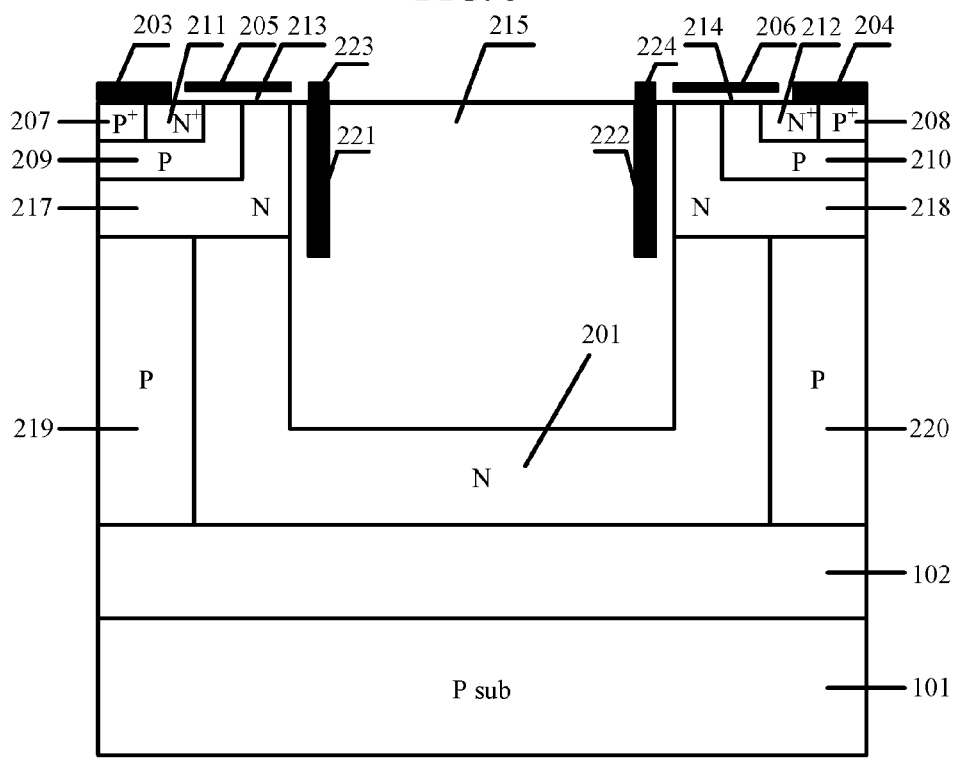
FIG. 4 is schematic diagram of a cell structure of a bidirectional MOS device in Example 2.

As shown in FIG. 4, the device in the example follows a basic structure in Example 1, except that a dielectric buried layer 102 is disposed between the P-type substrate 101 and the N-type region 201, the first P-type region 219, and the second P-type region 220.

The device in the example follows a basic working principle in Example 1, except that the dielectric buried layer is adapted to isolate the P-type substrate 101 from the active region, and the leakage current of the P-type substrate is modified; especially at the IGBT work mode, when the device is turned on, the MOS device as the collector having the high potential injects current to the electron holes of the P-type substrate, thus reducing the loss of the device, and isolating the MOS device from other devices.

Example 3

Figure 5:
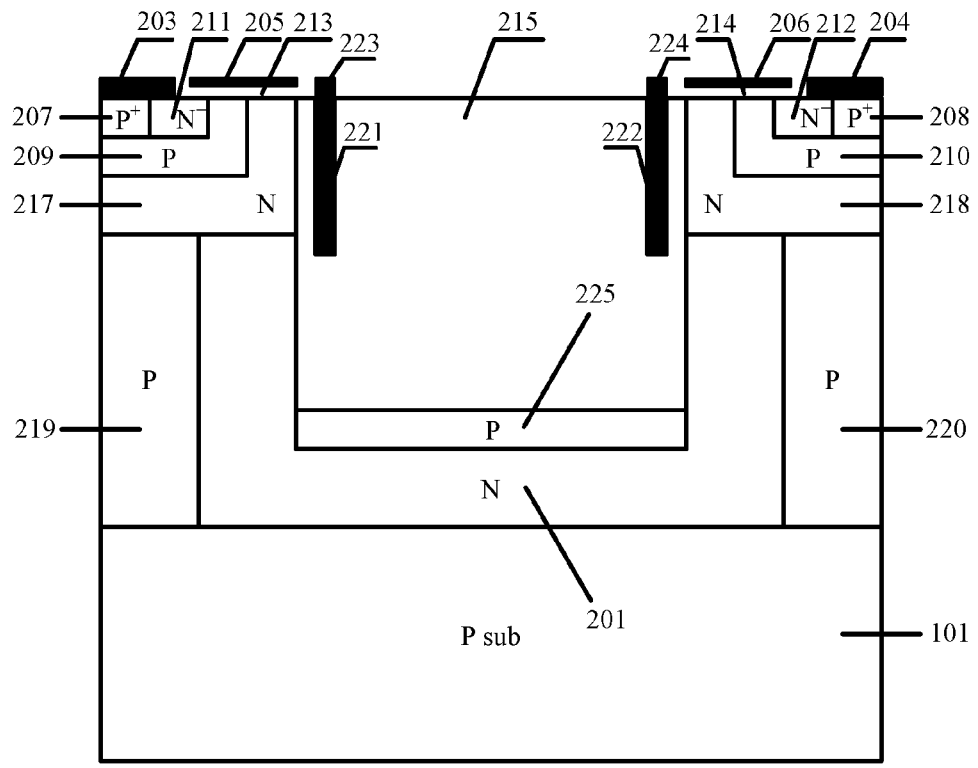
FIG. 5 is schematic diagram of a cell structure of a bidirectional MOS device in Example 3.

As shown in FIG. 5, the device in the example follows a basic structure in Example 1, except that a third P-type region 225 is disposed between a lower part of the dielectric slot 215 and the N-type region 201.

The device in the example follows a basic working principle in Example 1, except that the third P-type region 225 is adapted to provide an additional charge depletion effect when the device is blocked, thus the breakdown voltage of the device and the doping concentration of N-type region 201 can be further improved, and the performance of the device is further enhanced.

Example 4

Figure 6:
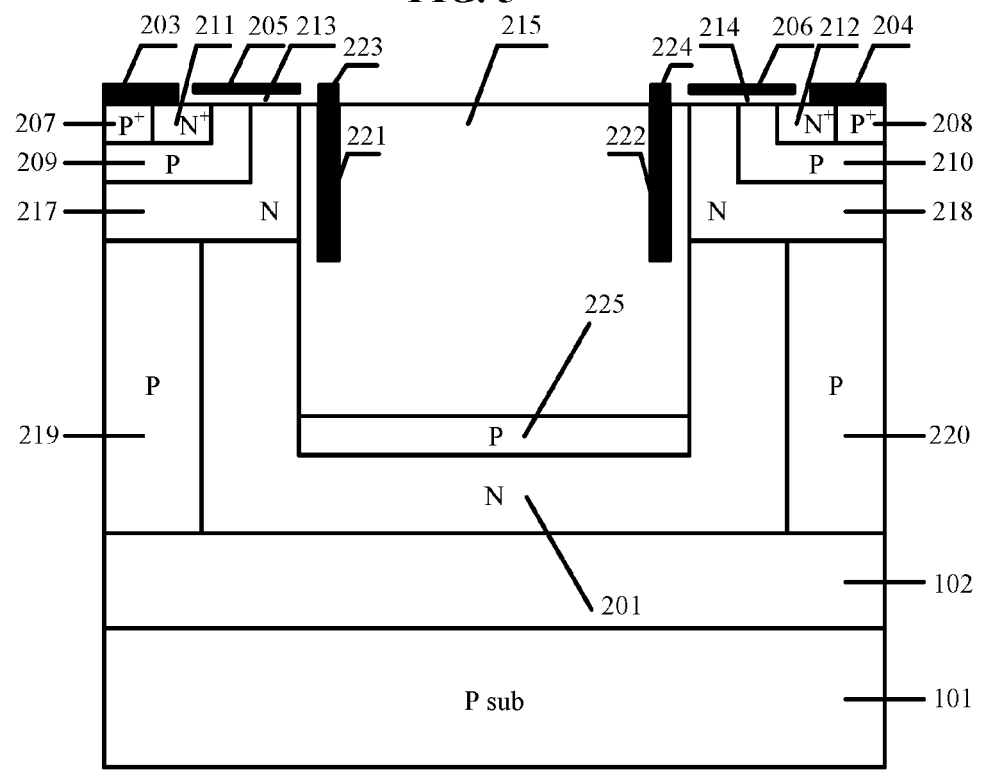
FIG. 6 is schematic diagram of a cell structure of a bidirectional MOS device in Example 4.

As shown in FIG. 6, the device in the example follows a basic structure in Example 2, except that a third P-type region 225 is disposed between a lower part of the dielectric slot 215 and the N-type region 201.

The device in the example follows a basic working principle in Example 2, except that the third P-type region 225 is adapted to provide an additional charge depletion effect when the device is blocked, thus the breakdown voltage of the device and the doping concentration of N-type region 201 can be further improved, and the performance of the device is further enhanced.

Example 5

Figure 7:
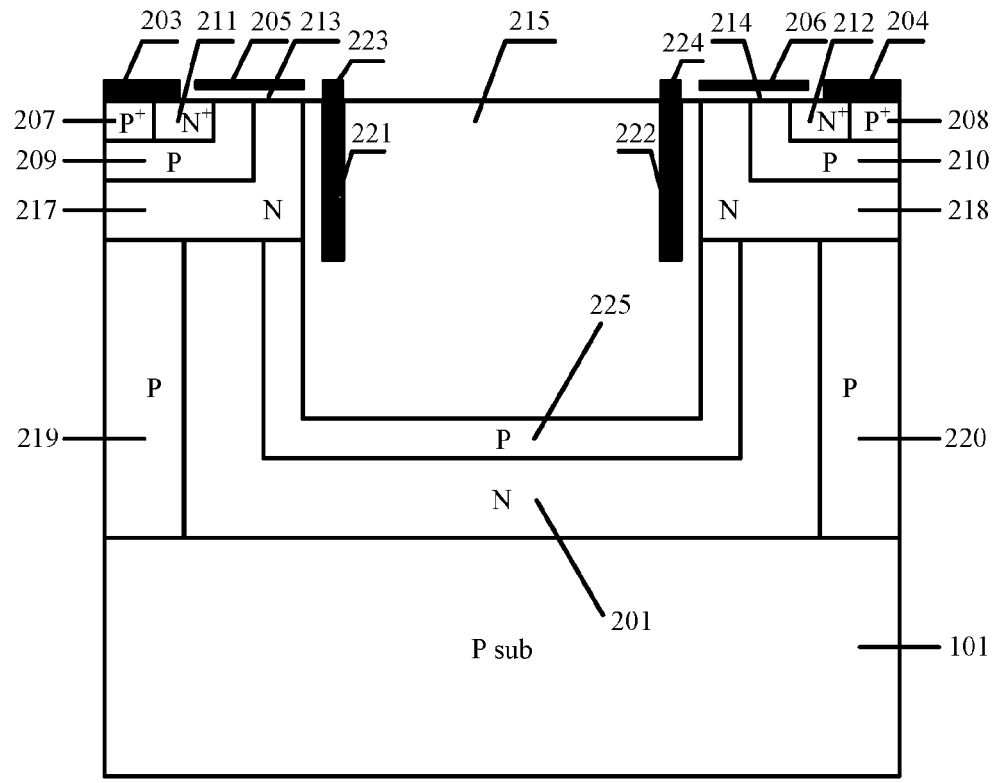
FIG. 7 is schematic diagram of a cell structure of a bidirectional MOS device in Example 5.

As shown in FIG. 7, the device in the example follows a basic structure in Example 1, except that the third P-type region 225 is disposed between the dielectric slot 215 and the N-type region; upper parts of the third P-type region 225 are respectively connected to a lower part of the first N-type layer 217 and a lower part of the second N-type layer 218, which means, the lower part of the dielectric slot is sheathed in the third P-type region 225.

The device in the example follows a basic working principle in Example 1, except that the third P-type region 225 is adapted to provide an additional charge depletion effect when the device is blocked, thus the breakdown voltage of the device and the doping concentration of N-type region 201 can be further improved, and the performance of the device is further enhanced.

Example 6

Figure 8:
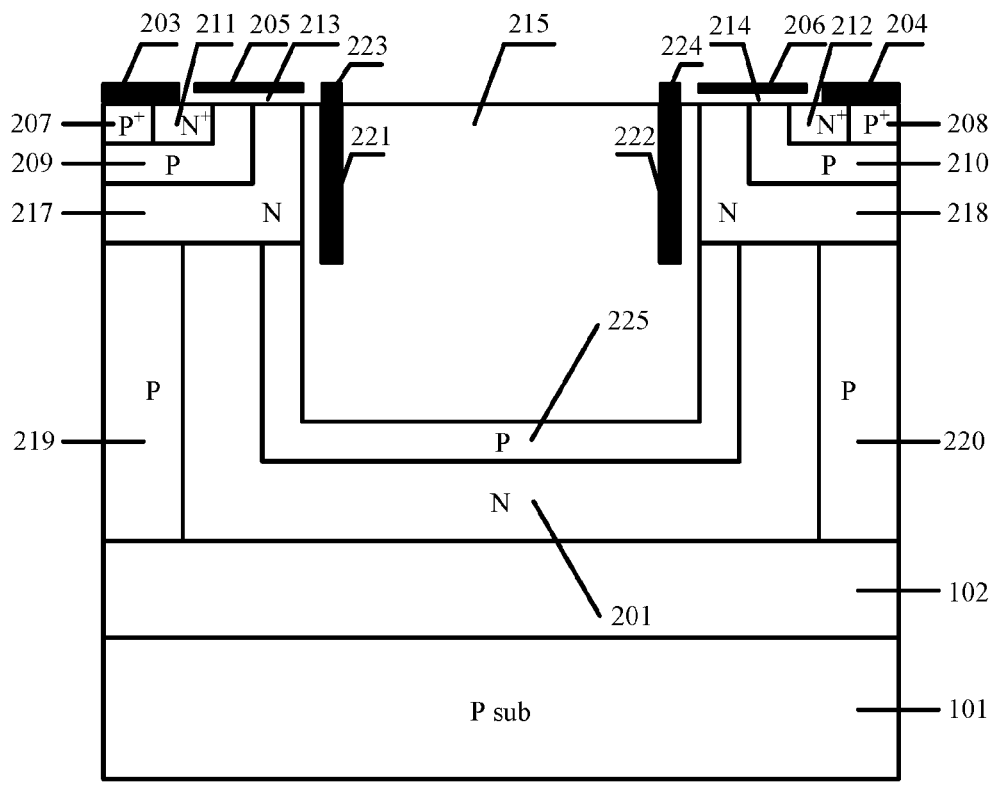
FIG. 8 is schematic diagram of a cell structure of a bidirectional MOS device in Example 6.

As shown in FIG. 8, the device in the example follows a basic structure in Example 2, except that the third P-type region 225 is disposed between the dielectric slot 215 and the N-type region; upper parts of the third P-type region 225 are respectively connected to a lower part of the first N-type layer 217 and a lower part of the second N-type layer 218, which means, the lower part of the dielectric slot is sheathed in the third P-type region 225.

The device in the example follows a basic working principle in Example 2, except that the third P-type region 225 is adapted to provide an additional charge depletion effect when the device is blocked, thus the breakdown voltage of the device and the doping concentration of N-type region 201 can be further improved, and the performance of the device is further enhanced.

Example 7

Figure 9:
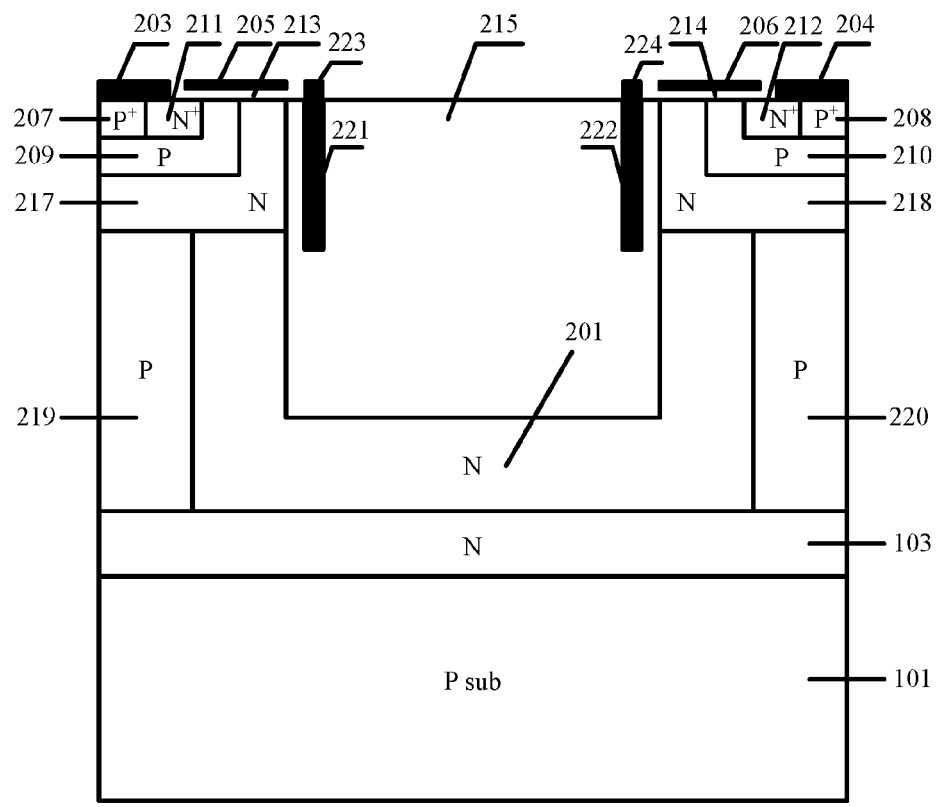
FIG. 9 is schematic diagram of a cell structure of a bidirectional MOS device in Example 7.

As shown in FIG. 9, the device in the example follows a basic structure in Example 1, except that a third N-type layer 103 is disposed between the P-type substrate 101 and the N-type region 201, the first P-type region 219, and the third N-type layer 103.

The device in the example follows a basic working principle in Example 1, except that the third N-type layer 103 is adapted to further decrease the resistance of the drift region, thus the performance of the device is further enhanced.

Example 8

Figure 10:
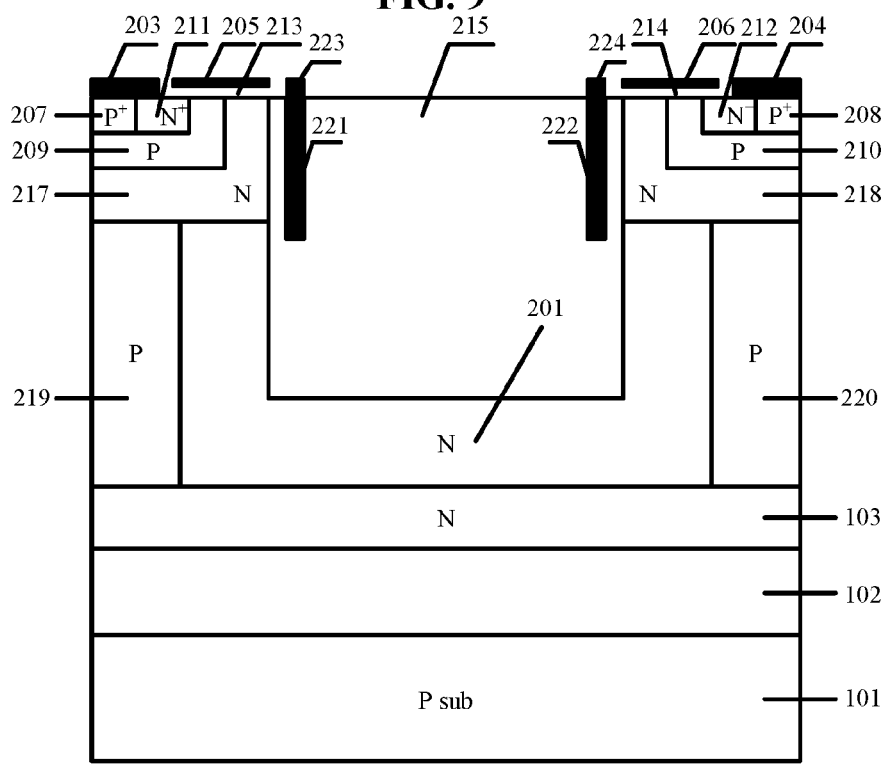
FIG. 10 is schematic diagram of a cell structure of a bidirectional MOS device in Example 8.

As shown in FIG. 10, the device in the example follows a basic structure in Example 2, except that the third N-type layer 103 is disposed between the dielectric buried layer 102 and the N-type region 201, the first P-type region 219, and the second P-type region 220.

The device in the example follows a basic working principle in Example 2, except that the third N-type layer 103 is adapted to further decrease the resistance of the drift region, thus the performance of the device is further enhanced.

Figure 11:
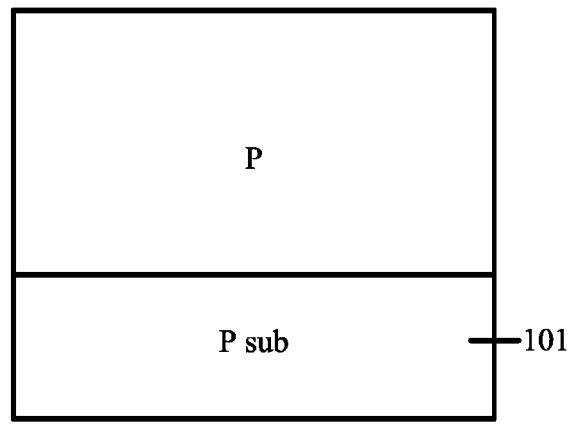
FIG. 11 is a schematic diagram showing an epitaxial growth of a P-type epitaxial layer on a P-type substrate of a bidirectional MOS device in Example 1.
Figure 12:
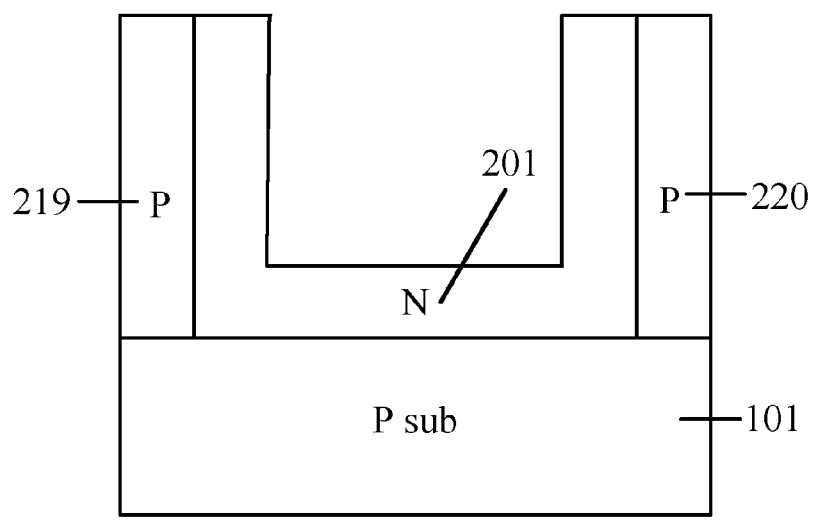
FIG. 12 is a schematic diagram showing a slot etching on an epitaxial layer and an injection of N-type impurity of a bidirectional MOS device in Example 1.
Figure 13:
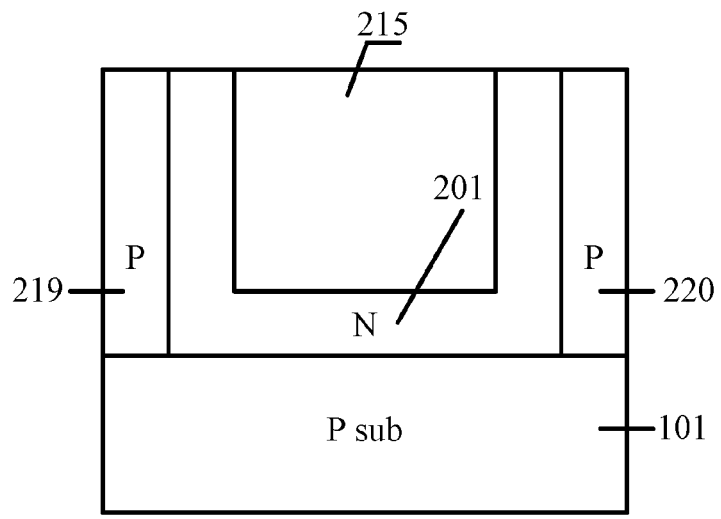
FIG. 13 is a schematic diagram showing a formation of a dielectric slot of a bidirectional MOS device in Example 1.
Figure 14:
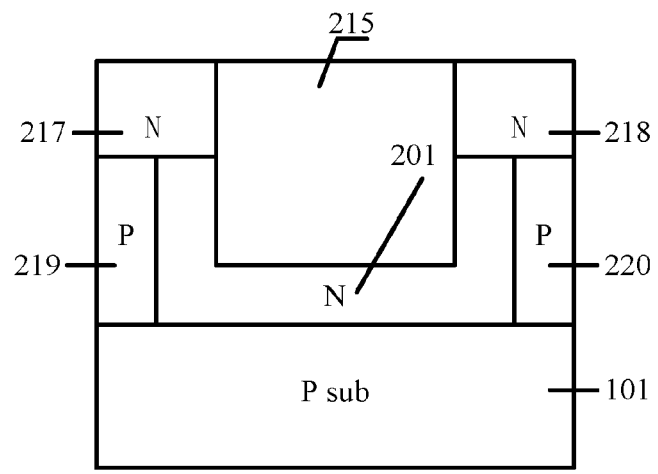
FIG. 14 is a schematic diagram showing a photoetching on two sides of an upper end of an active region and an injection of N-type impurity of a bidirectional MOS device in Example 1.
Figure 15:
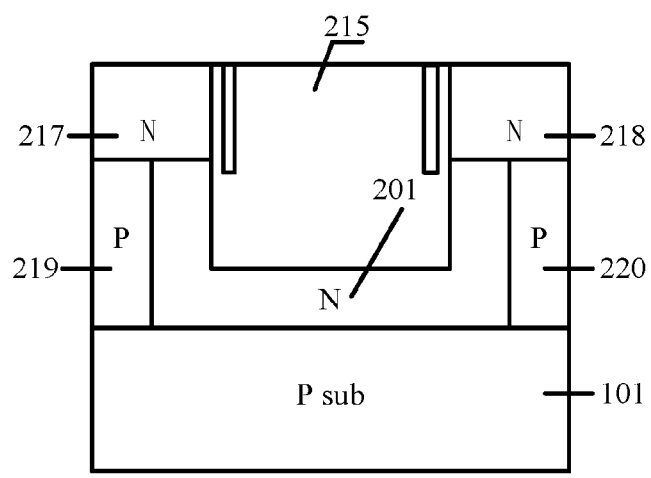
FIG. 15 is a schematic diagram showing an etching of filling slots in a dielectric slot of a bidirectional MOS device in Example 1.
Figure 16:
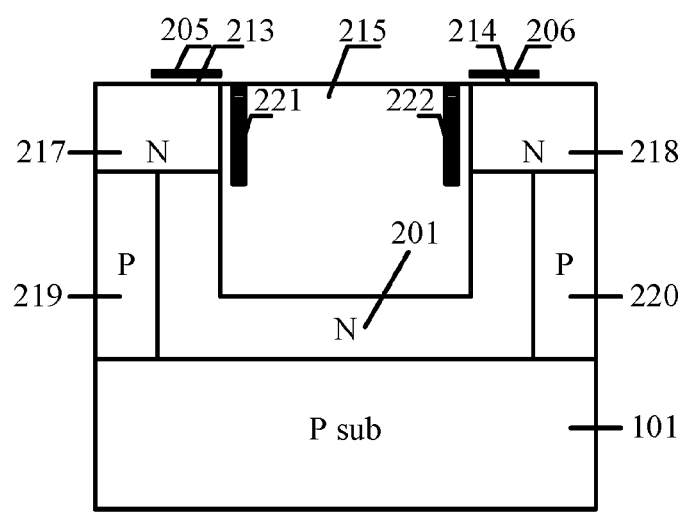
FIG. 16 is a schematic diagram showing a formation of gate structures and the filling of filling slots of a bidirectional MOS device in Example 1.
Figure 17:
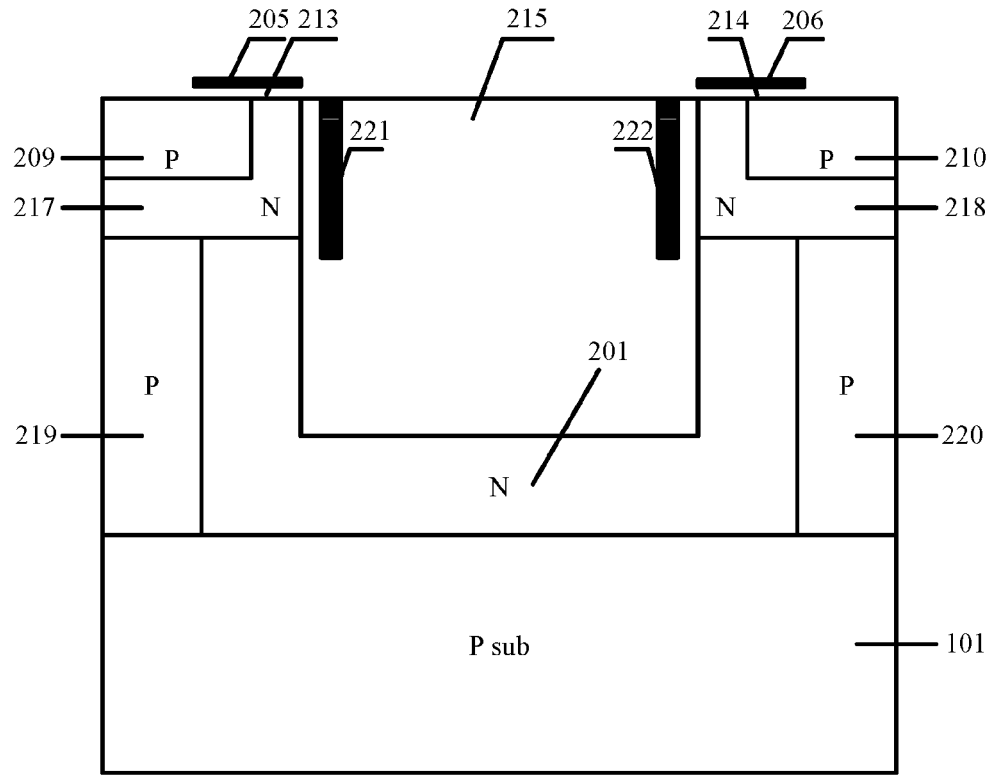
FIG. 17 is schematic diagram showing a formation of P-type body regions on two sides of an upper end of an active region of a bidirectional MOS device in Example 1.
Figure 18:
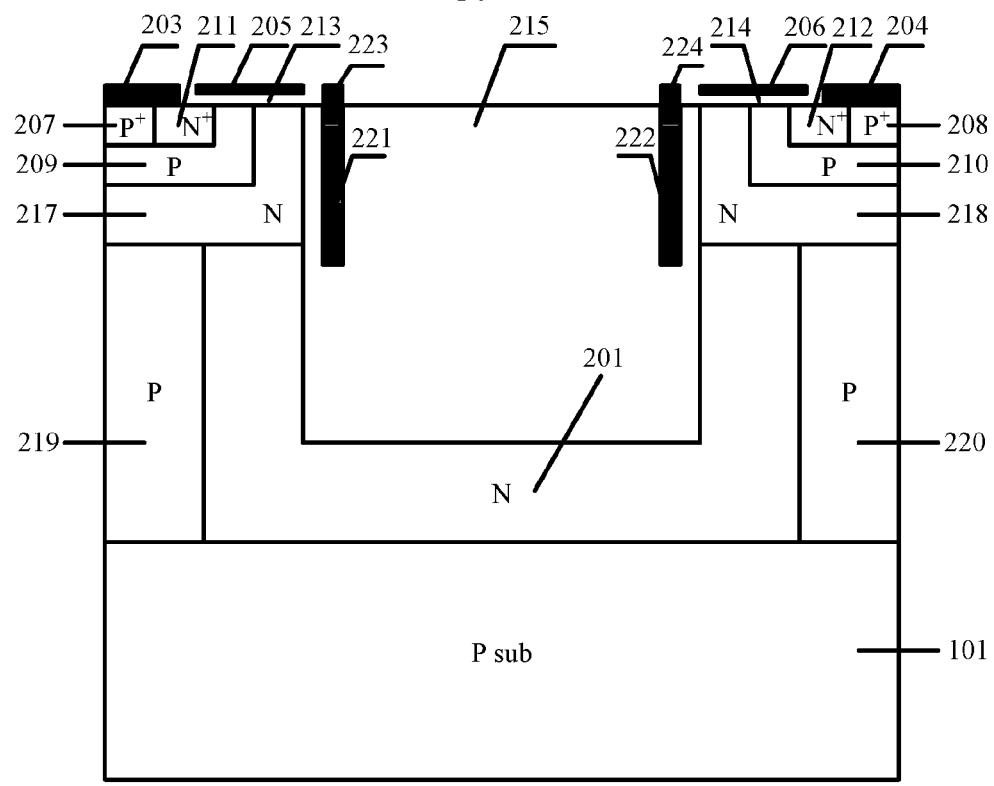
FIG. 18 is a schematic diagram of an MOS device prepared using a method in the invention in Example 1.

A method for preparing the bidirectional MOS device in Example 1, comprising:

1) allowing a P-type epitaxial layer to epitaxially grow on an upper surface of a P-type substrate 101, as shown in FIG. 11;

2) etching a slot on a central part of the P-type epitaxial layer using a photolithography process and an etching process; rotationally injecting N-type impurity from different angles in the slot using an ion implantation process, and forming an N-type region 201 on a side surface and a lower part of the slot; where a lower part of the N-type region 201 is connected to the upper surface of the P-type substrate 101; two sides of the P-type epitaxial layer containing no N-type impurity are a first P-type region 219 and a second P-type region 220; the first P-type region and the second P-type region are symmetrically disposed on two sides of the N-type region 201, as shown in FIG. 12;

3) filling the slot in 2) with dielectric by oxidation or deposition to form a dielectric slot 215, as shown in FIG. 13;

4) using the photolithography process and the ion implantation process to form a first N-type layer 217 having high doping concentration on a first upper part of the N-type region 201 and an upper part of the first P-type region 219, and to form a second N-type layer 218 having high doping concentration on a second upper part of the N-type region 201 and an upper part of the second P-type region 220; where the first N-type layer 217 and the second N-type layer 218 each are connected to the side surfaces of the dielectric slot 215, as shown in FIG. 14;

5) etching a first filling slot 221 on one side of the dielectric slot 215 which is near the first N-type layer 217 and etching a second filling slot 222 on another side of the dielectric slot which is near the second N-type layer 218 using the photolithography process and the etching process; where the first filling slot 221 and the second filling slot 222 are symmetrically disposed; widths and depths of the first filling slot 221 and the second filling slot 222 are far less than a width and a depth of the dielectric slot 215; the depths of the first filling slot 221 and the second filling slot 222 are larger than depths of the first N-type layer 217 and the second N-type layer 218, as shown in FIG. 15;

6) processing the surface of the MOS device by thermos-oxidative treatment and depositing conductive materials on oxide layers, the first filling slot 221, and the second filling slot 222; etching away needless conductive materials and the oxide layers using a photolithography process to form a first planar gate structure on an upper surface of the first N-type layer 217, and to form a second planar gate structure on an upper surface of the second N-type layer 218; filling the first filling slot 221 and the second filling slot 222 with the conductive materials; where the first gate structure comprises a first planar gate dielectric 213 and a first gate electrode 205; the first planar gate dielectric is disposed on an upper surface of the first N-type layer 217, and the first gate electrode is disposed on an upper layer of the first planar gate dielectric 213; the second gate structure comprises a second planar gate dielectric 214 and a second gate electrode 206; the second planar gate dielectric is disposed on an upper surface of the second N-type layer 218, and the second gate electrode is disposed on an upper layer of the second planar gate dielectric 214, as shown in FIG. 16;

7) injecting P-type impurity to one side of an upper end of the first N-type layer 217 to form a first P-type body region 209 using the photolithography process and the ion implantation process; injecting P-type impurity to one side of an upper end of the second N-type layer 218 to form a second P-type body region 210 using the photolithography process and the ion implantation process; the first P-type body region 209 and the second P-type body region 210 are symmetrical, as shown in FIG. 17;

8) injecting N-type impurity and P-type impurity respectively to the first P-type body region 209 to form a first N+ source region 211 and a first P+ contact region 207 using the photolithography process and the ion implantation process; where the first N+ source region 211 and the first P+ contact region 207 are independent; injecting N-type impurity and P-type impurity respectively to the second P-type body region 210 to form a second N+ source region 212 and a second P+ contact region 208 using the photolithography process and the ion implantation process; where the second N+ source region 212 and the second P+ contact region 208 are independent;

9) depositing and photoetching metal so as to form a first metal electrode 203 on upper surfaces of the first N+ source region 211 and the first P+ contact region 207, to form a second metal electrode 204 on upper surfaces of the second N+ source region 212 and the second P+ contact region 208, to form a third metal electrode 223 on an upper surface of the first filling slot 221, and to form a fourth metal electrode 224 on an upper surface of the second filling slot 222, as shown in FIG. 18.

Specifically, 1) comprises using silicon-on-insulator to form a dielectric buried layer 102 between the P-type substrate 101 and the P-type epitaxial layer.

Specifically, 1) comprises allowing an N-type epitaxial layer 103 to epitaxially grow on an upper surface of the P-type substrate 101; then allowing the P-type epitaxial layer to epitaxially grow on an upper surface of the N-type epitaxial layer; or using silicon-on-insulator to form a dielectric buried layer 102 between the P-type substrate 101 and the P-type epitaxial layer; then allowing an N-type epitaxial layer 103 to epitaxially grow between the dielectric buried layer 102 and the P-type epitaxial layer.

Specifically, 2) comprises injecting the P-type impurity to the N-type region 201 following a formation of the N-type region 201 to form a third P-type region 225; where the third P-type region is disposed beneath the dielectric slot 215, or injecting the P-type impurity from different angles to the N-type region 201 to form a third P-type region 225; where the third P-type region is disposed beneath and on side walls of the dielectric slot 215.

FIGS. 3-11 are examples of the invention based on the core idea of the invention. It should be obvious to those skilled in the art that the semiconductor materials used by the bidirectional MOS device are silicon, silicon carbide, gallium arsenide, or gallium nitride, and the dielectric materials used by the bidirectional MOS device are silica, hafnium oxide, or silicon nitride.

Advantages of the bidirectional MOS device and the method for preparing the same according to embodiments of the invention are summarized as follows:

A U-shaped symmetrical drift region, comprising the dielectric slot 215, the N-type region 201, the first filling slot 221, the second filling slot 222, (the first filling slot and the second filling slot are symmetrically arranged), the first N-type layer 217, the second N-type layer 218, (the first N-type layer and the second N-type layer are symmetrically arranged), the first P-type region 219, and the second P-type region 220 (the first P-type region and the second P-type region are symmetrically arranged) is able to achieve a high breakdown voltage and a low voltage drop or on-resistance. Thus the bidirectional MOS device is a symmetrical field stop device. At the IGBT work mode, the MOS device is an IGBT device featuring carrier storage layer and field stop layer; at the MOS work mode, the bidirectional MOS device is an MOS device featuring highly doped layer operating to decrease the resistance of the drift region and field stop layer. The compound effect of the U-shaped drift region prevents the transverse and longitudinal breakdown of the device or penetration, and endows the device with favorable voltage endurance per unit drift region length and low voltage drop and on-resistance, thereby obviously improving the performance of the device.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A bidirectional Metal-Oxide-Semiconductor (MOS) device, the device comprising a cell structure, the cell structure comprising:
    a P-type substrate; and
    an active region; the active region comprising a drift region, a first MOS structure and a second MOS structure; the first MOS structure comprising a first P-type body region, a first P+ contact region, a first N+ source region, a first metal electrode, and a first gate structure; the second MOS structure comprising a second P-type body region, a second P+ contact region, a second N+ source region, a second metal electrode, and a second gate structure; the drift region comprising a dielectric slot, a first N-type layer, a second N-type layer, and an N-type region;
wherein
    the active region is disposed on an upper surface of the P-type substrate; the first MOS structure and the second MOS structure are symmetrically disposed on two ends of an upper layer of the drift region;
    the first P+ contact region and the first N+ source region are disposed in the first P-type body region; the first metal electrode and the first gate structure are disposed on an upper surface of the first P-type body region; the first P+ contact region and the first N+ source region are independent, and upper surfaces of the first P+ contact region and the first N+ source region are respectively connected to the first metal electrode; the first gate structure is a planar gate structure, and comprises a first planar gate dielectric and a first gate electrode; the first gate electrode is disposed on an upper surface of the first planar gate dielectric;

the second P+ contact region and the second N+ source region are disposed in the second P-type body region; the second metal electrode and the second gate structure are disposed on an upper surface of the second P-type body region; the second P+ contact region and the second N+ source region are independent, and upper surfaces of the second P+ contact region and the second N+ source region are respectively connected to the second metal electrode; the second gate structure is the planar gate structure, and comprises a second planar gate dielectric and a second gate electrode; the second gate electrode is disposed on an upper surface of the second planar gate dielectric;

the first N-type layer and the second N-type layer are symmetrically disposed on two sides of the dielectric slot; the N-type region is disposed beneath the dielectric slot; a lower surface and a side surface of the first P-type body region are connected to the first N-type layer; a lower surface and a side surface of the second P-type body region are connected to the second N-type layer; the first N-type layer and the second N-type layer each are connected to a side surface on an upper end of the dielectric slot; a lower end of the dielectric slot is embedded in the N-type region; a central line of the dielectric slot is coincident with a central line of the N-type region and a central line of the MOS device; upper surfaces of the N-type region are respectively connected to the first N-type layer and the second N-type layer, and a lower surface of the N-type region is connected to the P-type substrate; a width and a depth of the dielectric slot are both larger than widths and depths of the first N-type layer and the second N-type layer; a depth of an embedded part of the dielectric slot is larger than a width of the dielectric slot, the depths of the first N-type layer and the second N-type layer, and a depth of the N-type region from a bottom surface of the dielectric slot to an upper surface of the P-type substrate;

a first P-type region is disposed between the first N-type layer and the P-type substrate; a second P-type region is disposed between the second N-type layer and the P-type substrate; the first P-type region and the second P-type region are symmetrically disposed on two sides of the N-type region, and are connected to side surfaces of the N-type region;

a first filling slot is disposed on one side of the dielectric slot which is near the first N-type layer; a second filling slot is disposed on another side of the dielectric slot which is near the second N-type layer; the first filling slot and the second filling slot are filled with conductive materials, and are symmetrically disposed; widths and depths of the first filling slot and the second filling slot are less than a width and a depth of the dielectric slot; the depths of the first filling slot and the second filling slot are larger than the depths of the first N-type layer and the second N-type layer; an upper part of the first filling slot is connected to a third metal electrode, and an upper part of the second filling slot is connected to a fourth metal electrode; the third metal electrode is in a short connection to the first metal electrode via a first metal wire on a surface of the MOS device; the fourth metal electrode is in a short connection to the second metal electrode via a second metal wire on the surface of the MOS device.

2. The MOS device of claim 1, wherein a third P-type region is disposed between a lower part of the dielectric slot and the N-type region.

3. The MOS device of claim 1, wherein a third P-type region is disposed between the dielectric slot and the N-type region; upper parts of the third P-type region are respectively connected to a lower part of the first N-type region and a lower part of the second N-type region.

4. The MOS device of claim 1, wherein a third N-type layer is disposed between the P-type substrate and the N-type region, the first P-type region, and the second P-type region.

5. A bidirectional Metal-Oxide-Semiconductor (MOS) device, the device comprising a cell structure, the cell structure comprising:

a P-type substrate;
a dielectric buried layer; and
an active region; the active region comprising a drift region, a first MOS structure and a second MOS structure; the first MOS structure comprising a first P-type body region, a first P+ contact region, a first N+ source region, a first metal electrode, and a first gate structure; the second MOS structure comprising a second P-type body region, a second P+ contact region, a second N+ source region, a second metal electrode, and a second gate structure; the drift region comprises a dielectric slot, a first N-type layer, a second N-type layer, and an N-type region;

wherein the dielectric buried layer is disposed on an upper surface of the P-type substrate, and the active region is disposed on an upper surface of the dielectric buried layer; the first MOS structure and the second MOS structure are symmetrically disposed on two ends of an upper layer of the drift region;

the first P+ contact region and the first N+ source region are disposed in the first P-type body region; the first metal electrode and the first gate structure are disposed on an upper surface of the first P-type body region; the first P+ contact region and the first N+ source region are independent, and upper surfaces of the first P+ contact region and the first N+ source region are respectively connected to the first metal electrode; the first gate structure is a planar gate structure, and comprises a first planar gate dielectric and a first gate electrode; the first gate electrode is disposed on an upper surface of the first planar gate dielectric;

the second P+ contact region and the second N+ source region are disposed in the second P-type body region; the second metal electrode and the second gate structure are disposed on an upper surface of the second P-type body region; the second P+ contact region and the second N+ source region are independent, and upper surfaces of the second P+ contact region and the second N+ source region are respectively connected to the second metal electrode; the second gate structure is the planar gate structure, and comprises a second planar gate dielectric and a second gate electrode; the second gate electrode is disposed on an upper surface of the second planar gate dielectric;

the first N-type layer and the second N-type layer are symmetrically disposed on two sides of the dielectric slot; the N-type region is disposed beneath the dielectric slot; a lower surface and a side surface of the first P-type body region are connected to the first N-type layer; a lower surface and a side surface of the second P-type body region are connected to the second N-type layer; the first N-type layer and the second N-type layer each are connected to a side surface on an upper end of the dielectric slot; a lower end of the dielectric slot is embedded in the N-type region; a central line of the dielectric slot is coincident with a central line of the N-type region and a central line of the MOS device; upper surfaces of the N-type region are respectively connected to the first N-type layer and the second N-type layer, and a lower surface of the N-type region is connected to the P-type substrate; a width and a depth of the dielectric slot are both larger than widths and depths of the first N-type layer and the second N-type layer; a depth of an embedded part of the dielectric slot is larger than a width of the dielectric slot, the depths of the first N-type layer and the second N-type layer, and a depth of the N-type region from a bottom surface of the dielectric slot to an upper surface of the dielectric buried layer;

a first P-type region is disposed between the first N-type layer and the dielectric buried layer; a second P-type region is disposed between the second N-type layer and the dielectric buried layer; the first P-type region and the second P-type region are symmetrically disposed on two sides of the N-type region, and are connected to side surfaces of the N-type region;

a first filling slot is disposed on one side of the dielectric slot which is near the first N-type layer; a second filling slot is disposed on another side of the dielectric slot which is near the second N-type layer; the first filling slot and the second filling slot are filled with conductive materials, and are symmetrically disposed; widths and depths of the first filling slot and the second filling slot are less than a width and a depth of the dielectric slot; the depths of the first filling slot and the second filling slot are larger than the depths of the first N-type layer and the second N-type layer; an upper part of the first filling slot is connected to a third metal electrode, and an upper part of the second filling slot is connected to a fourth metal electrode; the third metal electrode is in a short connection to the first metal electrode via a first metal wire on a surface of the MOS device; the fourth metal electrode is in a short connection to the second metal electrode via a second metal wire on the surface of the MOS device.

6. The MOS device of claim 5, wherein a third P-type region is disposed between a lower part of the dielectric slot and the N-type region.

7. The MOS device of claim 5, wherein a third P-type region is disposed between the dielectric slot and the N-type region; upper parts of the third P-type region are respectively connected to a lower part of the first N-type region and a lower part of the second N-type region.

8. The MOS device of claim 5, wherein a third N-type layer is disposed between the dielectric buried layer and the N-type region, the first P-type region, and the second P-type region.

* * * * *